Figure 1:
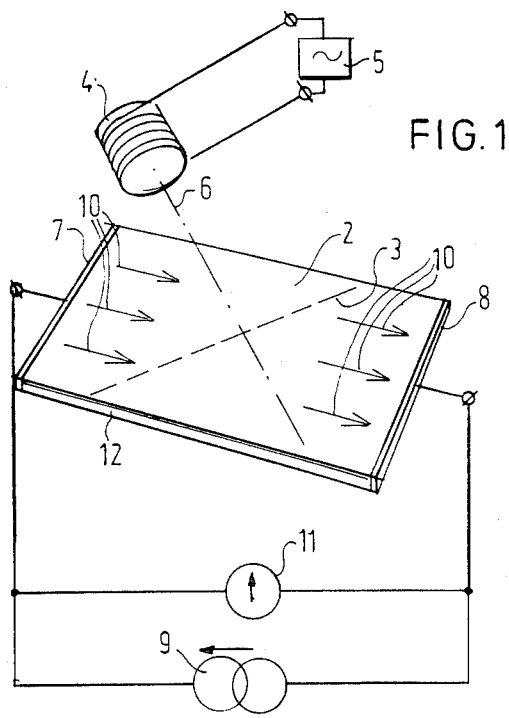

United States Patent [19]

de Ridder et al.

[11] Patent Number: 4,683,535
[45] Date of Patent: Jul. 28, 1987

[54] THIN FILM MAGNETOMETER

[75] Inventors: René M. de Ridder, Hengelo; Johannes H. J. Fluitman, Enschede, both of Netherlands

[73] Assignee: Stichting Centruum Voor Micro Electronika Twente, Enschede, Netherlands

[21] Appl. No.: 719,067

[22] Filed: Apr. 2, 1985

[51] Int. Cl.$^4$ .................................. G01R 33/02
[52] U.S. Cl. ..................... 324/249; 324/252
[58] Field of Search .................. 324/249, 252

[56] References Cited

U.S. PATENT DOCUMENTS

| 3,373,391 | 3/1968 | Böhm et al. | 324/251 X |
|---|---|---|---|
| 3,657,641 | 4/1972 | Kardashian | 324/249 |
| 3,774,134 | 10/1973 | Kardashian et al. | 324/249 X |
| 4,163,326 | 8/1979 | Edwards | 324/251 X |
| 4,223,292 | 9/1980 | Morikawa et al. | 324/251 X |
| 4,568,906 | 2/1986 | De Wilde et al. | 324/251 X |

FOREIGN PATENT DOCUMENTS 1541813 7/1969 Fed. Rep. of Germany .

OTHER PUBLICATIONS

Hoffman et al, "Factors Affecting the Performance of a Thin Film Magnetoresistive Vector Magnetometer", Journal of Applied Physics, Nov. 1982, pp. 8266-8268.

Primary Examiner—Reinhard J. Eisenzopf
Assistant Examiner—Robert W. Mueller
Attorney, Agent, or Firm—John P. Snyder

[57] ABSTRACT

A magnetometer made of thin film ferromagnetic material measures a component of an extraneous magnetic field which lies within the film at right angles to the direction of a magnetic field which is periodically excited within the film in opposite directions at sufficient intensity to saturate the film, in the presence of unidirectionally flowing current within the film along a path preferably extending at an angle of about 45° to the axis of anisotropy lying within the film.

11 Claims, 8 Drawing Figures

THIN FILM MAGNETOMETER

The invention relates to a thin film magnetometer comprising: a thin film of ferromagnetic material having an anisotropy axis in the plane of the film and of a known orientation, means for producing an auxiliary alternating magnetic field having a component in the plane of the film; and means for detecting variations of the magnetization in the film.

Such a magnetometer is known. Two main types are distinguished. In type I the auxiliary alternating field is applied normal to the anisotropy axis. In type II it is parallel to said axis. In both types variations of the magnetization component are detected normal to the direction of the auxiliary alternating field. Said variations are produced by the magnetic field component to be measured which is in the plane of the film and normal to the direction of the auxiliary alternating field. In the known magnetometers the means for detecting variations of the magnetization in the film are formed by a detection coil coupled with a measuring instrument capable of observing the voltage induced as a result of the magnetization variations in the coil and, as the case may be, of displaying it in the form already interpreted.

The use of a detection coil has the disadvantage that a coil necessarily has relatively large dimensions, which involves the inconvenience that such a magnetometer cannot be readily miniaturized.

A further disadvantage of the use of a coil is that its sensitivity for magnetization variations, decreases with a decrease in frequency of the auxiliary alternating magnetic field. Therefore, in known magnetometers it is necessary to use always a frequency which is always as high as possible.

The invention has for its object to design a magnetometer of the thin film type so that it is suitable for miniaturization whilst using known techniques such as semiconductor techniques.

A further object of the invention is to provide a magnetometer, the sensitivity of which is not dependent on the frequency of the applied auxiliary alternating magnetic field.

In order to achieve said purposes the invention, in general, provides a magnetometer of the type set forth in the preamble which is characterized in that the ferromagnetic material is of the type with an anisotropic magneto resistive effect such as the planar Hall effect, preferably, or the planar magneto resistive effect, a source is provided for passing an electric current through the film, the detection means are designed for observing the voltage across the two connections of the thin ferromagnetic film (application of the planar magneto resistive effect) or across the two Hall voltage contacts (in the use of the planar Hall effect), which voltage is representative of a magnetic field component to be measured in the plane of the film and normal to the direction of the auxiliary alternating field and the auxiliary alternating magnetic field has a strength such that it saturates the ferromagnetic material. The planar Hall voltage or the magneto resistive voltage depends on the angle between the magnetization and the direction of the current. This angle (which may have locally different values) is determined on the one hand by the instantaneous strength and direction of the auxiliary alternating field and on the other hand by the strength and direction (considered to be constant for one period of the auxiliary alternating field) of a field to be measured (also termed signal field). The measured voltage, which may be considered to be the sum of a large number of "microscopic" voltages so that averaging of the local variations takes place, thus contains inter alia information about the signal field to be measured.

It will be obvious that a measuring instrument can be used for measuring the detection voltage and for interpreting, for example, by electronic ways such that reading is obtained which directly provides the strength of the component of the magnetic field to be measured in the direction perpendicular to the alternating auxiliary magnetic field.

In order to obtain the highest possible sensitivity it is preferred to use an embodiment in which the anisotropy axis is mainly at an angle of predetermined value to the direction of the electric current through the film, which angle has for the planar Hall effect a value of 0° and for the magneto resistive effect a value of 45°.

The ferromagnetic material can advantageously be permalloy with a ratio of about 80% nickel and 20% of iron and preferably 81% of nickel and 19% of iron.

For producing an auxiliary magnetic field a coil and an alternating current generator for passing the current can be employed.

The magnetometer so far described is only suitable for measuring the magnetic field strength component in only one direction. It will be obvious that this does not provide full spatial information about strength and direction of a magnetic field.

For an optimal operation of the magnetometer the film preferably has a thickness of the order of 100 nm.

In order to determine a magnetic field fully unambiguously both with respect to magnitude and direction, it is possible in accordance with the invention to use an embodiment characterized by three thin films of ferromagnetic material having mutually orthogonal orientations, each film having its individual current source and individual detection means. In this case the magnetometer can be designed such that the means for producing the magnetic auxiliary alternating field for each of the three films comprise only one common coil which is disposed and orientated so that the direction vectors of the produced magnetic field at the areas of the films are mainly located in the plane of said films. In connection with noise properties it is preferred to use magnetometers of type I.

For the operation of the magnetometer embodying the invention of this type it is essential that at least part of the film should be saturated. According as the amplitude of the auxiliary field becomes larger, the decrease in the hysteresis improves the reproducibility of the magnetometer. According as the amplitude of the auxiliary field rises above a given minimum value, the sensitivity of the magnetometer decreases. According as the amplitude of the auxiliary field increases, the (undesirable) sensitivity of the magnetometer for the signal field component i.e. the component of the magnetic field to be measured parallel to the auxiliary field decreases with respect to the sensitivity of the signal field component at right angles thereto.

For a good understanding of the invention a short general concept of the basic principle of the magnetometer concerned will now be given.

The thin film of ferromagnetic material is periodically magnetized in relatively opposite directions by the auxiliary alternating magnetic field. These alterations partly take place by the rotation of the magnetization vector in the plane of the film. In this respect it is noted that the film is very thin and has, in practice, usually a thickness of 100 nm. Said rotation can be performed in two directions i.e. in clockwise and in anti-clockwise direction.

The anisotropy directions of the film locally can show differences from the mean value. This phenomenon is termed "angular dispersion". This has the result that in a given direction of the auxiliary field some domains have a preference for one direction of rotation and others for the other direction. If, apart from an auxiliary alternating field which is applied normal or parallel to the anisotropy axis, no external field is applied, the two kinds of domains will each occupy half the film surface. If a magnetic field component i.e. a component of the field to be measured is present in the plane of the film and perpendicular to the direction of the auxiliary field one of the two directions of rotation will be preferred so that the overall surface of the domains associated with the preferred direction will increase in dependence on the strength of the field to be measured.

On an average across the whole film the magnetization component normal to the direction of the auxiliary field is observed, which varies with twice the frequency of the auxiliary field, whilst the amplitude and the phase thereof depend on the strength and the direction respectively of the field to be measured.

As stated above, in the prior art magnetometers said magnetization variations are inductively detected i.e. by a detection coil.

According to the invention a different type of detection is used, which is based on a planar, galvanomagnetic effect, which may be the planar Hall effect and the planar magneto resistive effect.

In this respect it is noted for explanation that in permalloy the restivity measured in a direction parallel to the magnetization vector has a value different from that in a direction normal to the vector. This results inter alia in that in a Hall configuration a transverse voltage occurs, which is determined by the angle between the magnetization vector and the direction of the current passing through the film.

Figure 3:
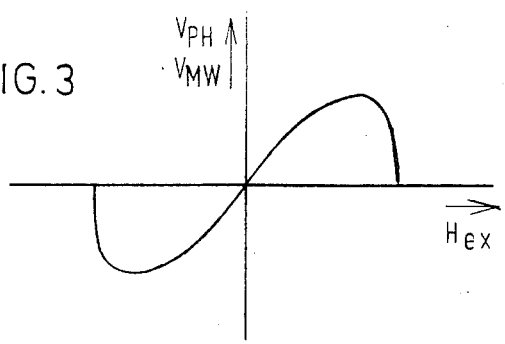
Figure 4:
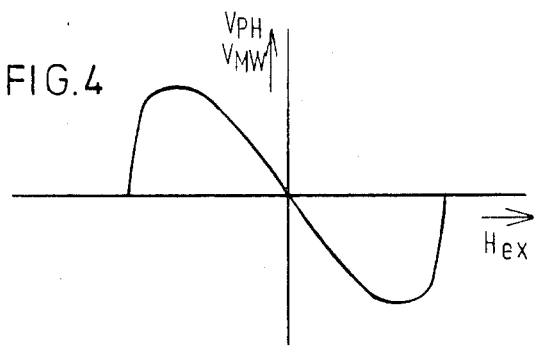

FIGS. 3 and 4 illustrate for a magnetometer of type I the planar Hall voltage $V_{PH}$ or the magneto resistive voltage $V_{MW}$ in rotation to the left and in rotation to the right respectively as a function of the strength of the applied auxiliary alternating field $H_{ex}$. It appears therefrom that domains give contributions of opposite sign to the overall voltage so that the amplitude of the total voltage is a measure for the ratio of the two kinds of domains and hence for the strength of the magnetic field to be measured. The reversal of the direction of the field to be measured produces a voltage of opposite phase. In a magnetometer of type II the voltage forms differ from those shown in FIGS. 3 and 4, but also in this case the reversal of the direction of rotation produces a phase reversal of the signal voltage as a function of the auxiliary alternating field.

Figure 5:
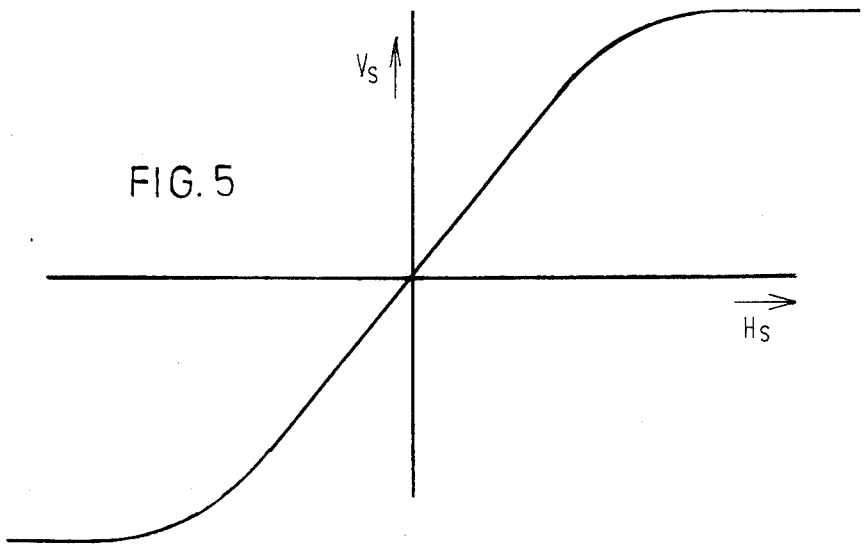

When the amplitude of the signal voltage $V_s$ is indicated as a function of the signal field strength $H_s$ (in which the amplitudes of voltages of opposite phases are indicated by opposite signs) the relationship shown in FIG. 5 is obtained.

For higher values of $H_s$ saturation rapidly occurs: the measuring range of the magnetometer is limited. A solution thereof can be found in using a compensation measuring method known per se. According to this method a field of a direction opposite that of the signal field is applied. The signal voltage is used to accurately equalize the strength of the compensation field to the signal field strength. The magnetometer serves in this case only as a zero detector. The linearity is determined only by the coil or the current strip producing the compensation field.

So far only a comparison is made between the inductive detection method of known technology and the detection proposed by the invention. With respect to the "normal" Hall effect the magnetometer embodying the invention has further two important advantages: it has a higher sensitivity and is free of (temperature-dependent) offset voltages.

The constuction of compasses, the detection of magnetizable masses (for example, steel pipes) by detecting local disturbances of the earth magnetic field, the detection of magnetic masses and so forth, may be conceived as domains.

Figure 2:
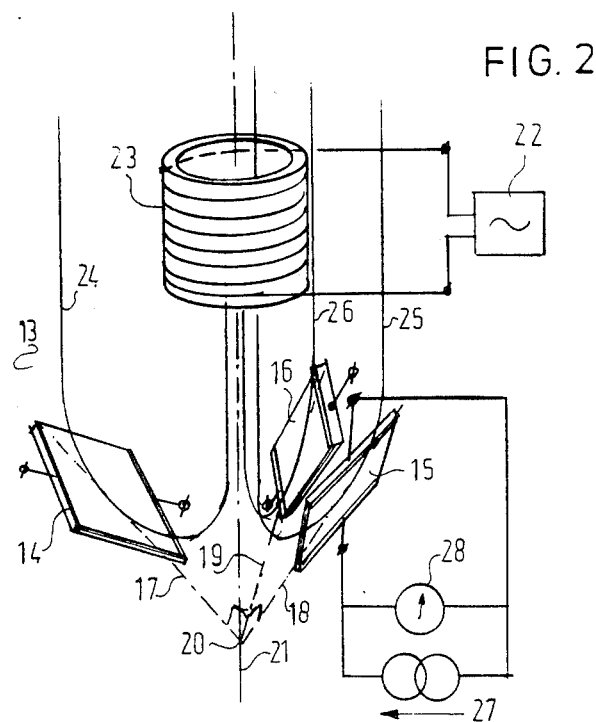
Figure 6:
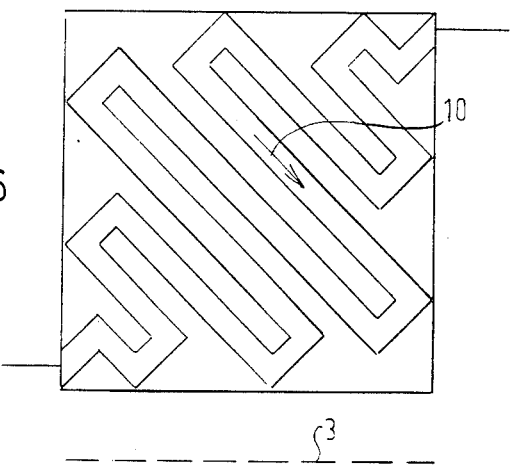
Figure 7:
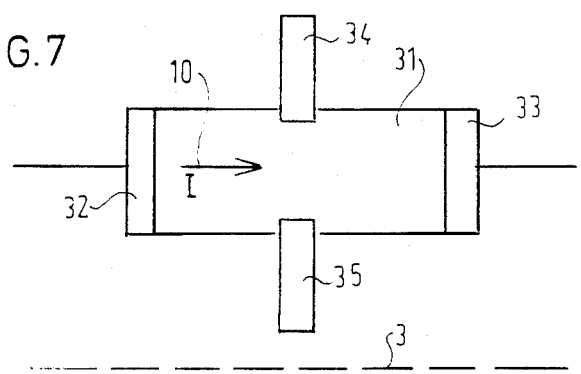
Figure 8:
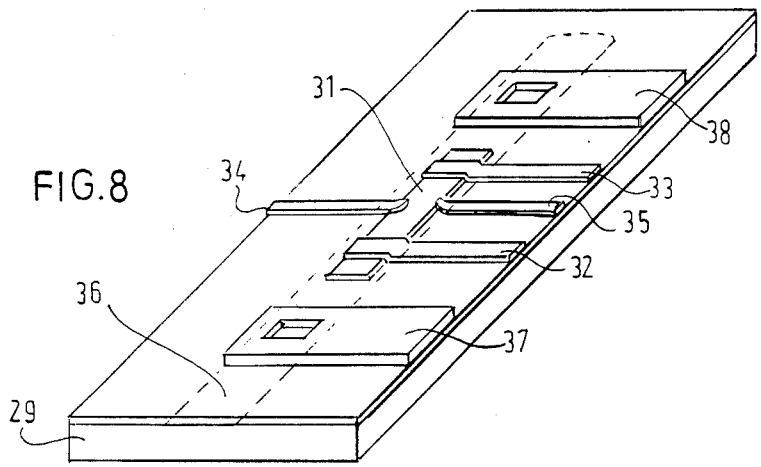

The invention will now be described more fully with reference to the drawing showing two arbitrary embodiments of type I, to which the invention is not limited. The drawing shows in:

FIG. 1 a strongly schematized, perspective view of a magnetometer acting only for a field component in one direction;

FIG. 2 a strongly schematized, perspective view of a second embodiment of the magnetometer in accordance with the invention, which is capable of providing full information about a magnetic field;

FIGS. 3 and 4 schematic graphs of the planar Hall voltage or the magneto resistive voltage for magnetic field rotating to the left and to the right respectively;

FIG. 5 a representation of the signal voltage as a function of the signal field strength;

FIG. 6 an example of a configuration advantageously used with the aid of the magneto resistive effect;

FIG. 7 a configuration advantageously used in the case of the planar Hall effect; and FIG. 8 schematically a magnetometer with a current strip for producing the magnetic auxiliary field.

FIG. 1 shows a first embodiment of a magnetometer of type I generally designated by reference numeral 1. It comprises a thin film 2 of permalloy the mean anisotropy axis 3 of which is indicated by a broken line.

The magnetometer 1 comprises furthermore a coil 4 with or without a core which is energized by an alternating-current generator 5. The axis 6 of the coil 4 is located in the plane of the film 2.

The film 2 as is shown in FIG. 1 has a rectangular shape and is somewhat elongate. On the short sides are arranged electrodes 7, 8, which serve to connect a current source 9 to the film 2 so that a current will flow in the direction indicated by arrows 10.

A voltage meter 11 serves to measure the electric voltage across the current source 9, which is a measure for the value of the resistance of the film 2 between the electrodes 7 and 8. This resistance is representative of the component of the magnetic field to be measured along the anisotropy axis 3.

It is noted that the film 2 is so thin that it is carried by an insulating substrate 12 plate. In this embodiment the thickness of the film 2 is about 100 nm.

FIG. 2 shows a magnetometer generally designated by 13, which is designed for giving full information about a magnetic field i.e. the magnitude and the direction of the field in the region of the meter.

The magnetometer 13 comprises three ferromagnetic films 14, 15 and 16 of the same structure as the film 2 of FIG. 1. The respective anisotropy axes 17, 18, 19 are at right angles to one another and intersect at a point 20. The point 20 is located on the longitudinal axis 21 of a coil 23 energized by the alternating-current generator 22. It provides the magnetic auxiliary field for each of the three films 14, 15, 16. There are schematically shown a few field lines 24, 25, 26 which are characteristic of the shape of the magnetic field produced by coil 23 in the vicinity of the films 14, 15, 16. It will be obvious that the anisotropy axes 17, 18, 19 may be relatively arranged in a different way at right angles to one another. The configuration of FIG. 2 ensures, however, for the three films 14, 15, 16 the same auxiliary field amplitude.

For the film 15 is shown a current source 27 and a voltage meter 28, in accordance with the configuration of FIG. 1. For the sake of clarity of FIG. 2 the arrangements for films 14 and 16 are not shown. It will be obvious that such arrangements have to be also provided for these two films.

It is noted that for the sake of simplicity the voltage meter 11 and 28 in the figures are shown as volt meters. In practice, however, an electronic signal processing unit will be used, the output of which is coupled, if necessary, through an interpreting unit, with display means, for example, rotary coil meter or a digit indicator. The output may also be coupled with a computer for processing the measurement results.

FIG. 6 shows an embodiment that can be advantageously used in connection with the magneto resistive effect, in which the direction of the current 10 is at an angle of about 45° to the anisotropy axis 3. In this magneto resistive configuration the length of the ferromagnetic conductor is preferably as large as possible as long as the width of the conductor does not become too small (there occurs a demagnetizing field counteracting the auxiliary field, the strength of which is proportional to the ratio between thickness and width of the film).

FIG. 7 shows a configuration suitable for use with a planar Hall effect. The direction of the electric current 10 is at an angle of 0° to the anisotropy axis 3. The width of the film is preferably chosen so as to be as large as possible as long as the ratio between length and width does not become much smaller than 2 (short circuit of Hall voltage due to current contacts).

FIG. 8 shows an integrated magnetometer operating on the basis of the planar Hall effect. It comprises a silicon substrate 29, a silicon dioxide layer applied thereto, a thin film 31 of permalloy having end connections 32, 33, central connections 34, 35 (see also FIG. 7), a strip 36 of conductive material for passing an alternating current via connections 37, 38 through the strip 36 for producing a transversal auxiliary alternating magnetic field.

It will be obvious that the invention is not limited to the embodiments shown and that many modifications and adaptations to specific requirements are possible without going beyond the scope of the invention.

We claim:

1. A magnetometer comprising the combination of a thin film of ferromagnetic material having an axis of anisotropy lying within the film, means for passing unidirectional electric current along a path lying within said film, means for periodically magnetizing said ferromagnetic material in relatively opposite directions with an alternating magnetic field extending within the film and of sufficient strength to saturate at least a part of the ferromagnetic material through which the current passes, and means for detecting a change in electrical property of that part of the film which is saturated and affected by the presence of an extraneous magnetic field having a component lying within the ferromagnetic material perpendicular to said opposite directions.

2. A magnetometer as defined in claim 1 wherein the axis of anisotropy is oriented to lie at an angle of about 45° to the direction of unidirectional current flow and said means for detecting comprises mechanism for measuring voltage associated with the current flow.

3. A magnetometer as defined in claim 2 wherein the alternating magnetic field is substantially perpendicular to the axis of anisotropy.

4. A magnetometer as defined in claim 1 wherein the axis of anisotropy is oriented to lie substantially in the direction of current flow and said means for detecting measures change due to the Hall effect across the direction of current flow.

5. A magnetometer as defined in claim 4 wherein the alternating magnetic field is substantially perpendicular to the axis of anisotropy.

6. A magnetometer as defined in claim 1 including three of said thin films of ferromagnetic material oriented relative to each other so that their axes of anisotropy lie in mutually orthogonal planes, said means for exciting being oriented to excite alternating magnetic field in all three films in substantially the same orientation to their respective axes of anisotropy, and there being a means for detecting associated with each of the films.

7. A magnetometer as defined in claim 6 wherein said axes of anisotropy meet at a common point and said means for exciting comprises an electromagnetic coil having its axis passing through said point.

8. A magnetometer comprising the combination of a thin film of ferromagnetic material having an axis of anisotropy lying within the film, means for passing unidirectional electric current along a path lying within said film, means for periodically magnetizing said ferromagnetic material in relatively opposite directions with an alternating magnetic field extending within the film and of sufficient strength to saturate at least a part of the ferromagnetic material through which the current passes and means for measuring change in magnetic resistivity of that part of the film which is saturated and caused by the presence of an extraneous magnetic field having a component lying within the film perpendicular to said opposing directions.

9. A magnetometer comprising the combination of an elongate strip of thin film ferromagnetic material having an axis of anisotropy lying in the plane of the film and extending along the length of the strip, said strip defining opposite sides and opposite ends, means for passing unidirectional electric current lengthwise through said strip, means for periodically magnetizing said ferromagnetic material in relatively opposite directions within said film with an alternating magnetic field extending within the film substantially perpendicular to the direction of said axis of anisotropy and of sufficient strength to saturate at least a part of the ferromagnetic material through which the current passes, and voltage responsive means for measuring change in magneto resistivity of that part of the film which is saturated film and caused by the presence of an extraneous magnetic field lying within the film and having a component extending lengthwise of the strip.

10. A magnetometer as defined in claim 9 wherein said strip is of meandering shape.

11. A magnetometer as defined in claim 9 said strip is of a thickness in the order of 100 nm, said strip being mounted on a substrate including a conductive strip underlying the ferromagnetic strip, said means for exciting comprising a source of alternating current connected to said conductive strip to excite an alternating magnetic field which extends between the opposite sides of the ferromagnetic strip, said ferromagnetic strip having contacts adjacent the opposite ends thereof and said means for passing including a current source connected to said contacts, said ferromagnetic strip also having additional contacts at the opposite sides thereof and said means for detecting being connected to said additional contacts.

* * * * *